US009767921B1

(12) United States Patent
Pan

(10) Patent No.: US 9,767,921 B1
(45) Date of Patent: Sep. 19, 2017

(54) TIMING BASED ARBITER SYSTEMS AND CIRCUITS FOR ZQ CALIBRATION

(71) Applicant: MICRON TECHNOLOGY, INC., Boise, ID (US)

(72) Inventor: Dong Pan, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/396,259

(22) Filed: Dec. 30, 2016

(51) Int. Cl.
| G11C 8/10 | (2006.01) |
| G06F 11/30 | (2006.01) |
| G11C 29/50 | (2006.01) |
| G11C 5/14 | (2006.01) |
| G11C 8/06 | (2006.01) |
| G06F 11/34 | (2006.01) |

(52) U.S. Cl.
CPC .... *G11C 29/50008* (2013.01); *G06F 11/3037* (2013.01); *G06F 11/348* (2013.01); *G11C 5/147* (2013.01); *G11C 8/06* (2013.01); *G11C 8/10* (2013.01)

(58) Field of Classification Search
CPC ........ G11C 2207/2254; G11C 11/4076; G11C 2207/105; G11C 29/023; G11C 29/48; G11C 8/06; G11C 8/10; H03K 19/0005; H03K 19/17545; H03K 19/018557; G06F 13/1605; G06F 3/0629; G06F 3/0683; G06F 3/0688
See application file for complete search history.

(56) References Cited

U.S. PATENT DOCUMENTS

| 4,511,959 | A | 4/1985 | Nicolas et al. |
| 4,745,548 | A | 5/1988 | Blahut |
| 6,661,860 | B1 * | 12/2003 | Gutnik .................. H04L 1/205 375/226 |
| 7,039,824 | B2 * | 5/2006 | Simon .................. H04L 7/0008 327/19 |
| 7,432,731 | B2 | 10/2008 | Bains et al. |
| 7,436,202 | B2 | 10/2008 | Lin et al. |
| 7,990,174 | B2 * | 8/2011 | Park ...................... G11C 5/06 326/30 |
| 9,318,183 | B2 * | 4/2016 | Ware .................... G06F 3/0619 |

(Continued)

FOREIGN PATENT DOCUMENTS

WO 2010144624 A1 12/2010

OTHER PUBLICATIONS

U.S. Appl. No. 14/883,377, entitled "Apparatuses and Methods for Arbitrating a Shared Terminal for Calibration of an Impedance Termination", filed Oct. 14, 2015.

(Continued)

*Primary Examiner* — Vibol Tan
(74) *Attorney, Agent, or Firm* — Dorsey & Whitney LLP

(57) ABSTRACT

Systems and apparatuses are provided for an arbiter circuit for timing based ZQ calibration. An example system includes a resistor and a plurality of chips. Each of the plurality of chips further includes a terminal coupled to the resistor, a register storing timing information, and an arbiter circuit configured to determine whether the resistor is available based, at least in part, on the timing information stored in the register. The timing information stored in the register of each respective chip of the plurality of chips is unique to the respective chip among the plurality of chips.

20 Claims, 6 Drawing Sheets

(56) References Cited

U.S. PATENT DOCUMENTS

| | | |
|---|---|---|
| 2004/0128429 A1 | 7/2004 | Khandekar et al. |
| 2004/0174185 A1* | 9/2004 | Lin .................... H03K 19/0005 326/30 |
| 2004/0240255 A1 | 12/2004 | Smith et al. |
| 2005/0226080 A1 | 10/2005 | Lee |
| 2006/0158198 A1 | 7/2006 | Fujisawa |
| 2009/0009212 A1 | 1/2009 | Brox |
| 2011/0128038 A1 | 6/2011 | Ko |
| 2011/0283060 A1* | 11/2011 | Ware .................... G06F 13/1636 711/106 |
| 2013/0015880 A1 | 1/2013 | Haraguchi |
| 2014/0185384 A1 | 7/2014 | Kim et al. |
| 2014/0185401 A1 | 7/2014 | Yang et al. |
| 2015/0067292 A1 | 3/2015 | Grunzke |
| 2015/0340069 A1* | 11/2015 | Arai ..................... G11C 29/021 326/30 |
| 2015/0364177 A1* | 12/2015 | Lee .......................... G11C 7/14 365/189.07 |
| 2016/0042769 A1* | 2/2016 | Moran ..................... G11C 7/22 711/105 |
| 2017/0109091 A1* | 4/2017 | Gans ..................... G06F 3/0604 |
| 2017/0109249 A1* | 4/2017 | Tatapudi ............... G06F 11/348 |

OTHER PUBLICATIONS

U.S. Appl. No. 14/883,454, entitled "Apparatuses and Methods for Arbitrating a Shared Terminal for Calibration of an Impedance Termination" filed Oct. 14, 2015.

Singh, et al., "Mousetrap: High-Speed Transition-Signaling Asynchronous Pipelines", IEEE Transactions on Very Large Scale Integration (VLSI) Systems, vol. 15, No. 6, Jun. 2007 15 pages.

U.S. Appl. No. 15/630,901, entitled "Timing Based Arbitration Methods and Apparatuses for Calibrating Impedances of a Semiconductor Device" filed Jun. 22, 2017.

\* cited by examiner

TIMING BASED ARBITER SYSTEMS AND CIRCUITS FOR ZQ CALIBRATION

BACKGROUND

In various DRAM and SDRAM application, ZQ calibration is used to tune the drive strength of output drivers and on-die termination (ODT) values across multiple chips and/or devices. Multi-chip packages, package on packages (POP) or multi-channel chips are generally only provided with one external ZQ resistor. Thus, at any given time, the ZQ resistor can only be used by a single chip for ZQ calibration. When two or more chips request to use the ZQ resistor at the same time, an arbiter circuit is typically used to determine which chip should access the ZQ resistor. Accordingly, only one chip can access the ZQ resistor, and a subsequent chip may only access the ZQ resistor after ZQ calibration has been completed.

Conventional arbiter circuits rely on a voltage based arbitration scheme to determine which chip, a master chip or slave chip, has issued a ZQ calibration request. For example, a ZQ calibration request issued by the master chip may have a strong pulldown, while a ZQ calibration request issued by the slave chip may have a weak pulldown. Thus, the various states of use of the ZQ resistor may be determined, via the ZQ pad voltage, such as 1) whether the ZQ resistor is not in use; 2) whether the master chip has issued a ZQ calibration request; 3) whether the slave chip has issued a ZQ calibration request; and 4) whether the ZQ resistor is currently in use for ZQ calibration. In order to differentiate between the four states, typically the ZQ pad voltages associated with each of the above four states rely on wide potential differences. Thus, conventional voltage-based arbitration schemes are typically limited to working effectively for 2-chip packages with a VDDQ of 1.1 V. Chip packages with more than 2-chips, or utilizing VDDQ lower than 1.1 V may not be able to effectively differentiate between the four states via the ZQ pad voltage.

Thus, an arbitration circuit implementing an arbitration scheme is needed for a system having a plurality of chips and low-power memory applications.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

The following detailed description illustrates a few exemplary embodiments in further detail to enable one of skill in the art to practice such embodiments. The described examples are provided for illustrative purposes and are not intended to limit the scope of the invention. In the following description, for the purposes of explanation, numerous specific details are set forth in order to provide a thorough understanding of the described embodiments. It will be apparent to one skilled in the art, however, that other embodiments of the present invention may be practiced without some of these specific details.

Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers herein used to express quantities, dimensions, and so forth, should be understood as being modified in all instances by the term "about." in this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Figure 1:
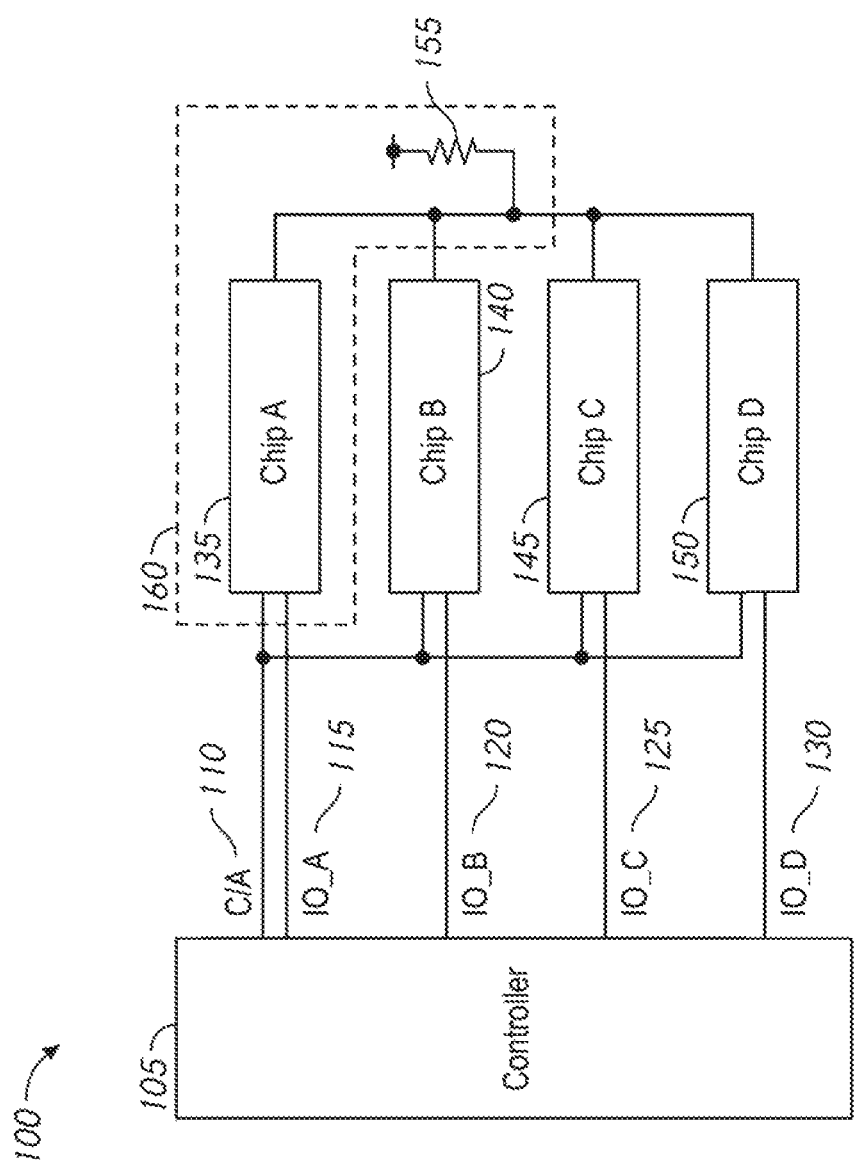
FIG. 1 is a schematic block diagram of a multi-chip semiconductor device, in accordance with various embodiments.

FIG. 1 illustrates a schematic block diagram of a multi-chip semiconductor device 100, according to various embodiments. The multi-chip semiconductor device 100 may include controller 105, a command/address bus 110, respective I/O buses IO_A 115, IO_B 120, IO_C 125, and IO_D 130, chip A 135, chip B 140, chip C 145, chip D 150, and ZQ resistor 155. These elements may be packaged in multi-chip packages (MCP) or package on packages (POP). In the following embodiments, the terms chip and die may be used interchangeably. In some embodiments, the controller 105 may be a memory controller. The controller 105 may be implemented as part of the same chip, a separate chip, or integrated into another chip, such as a microprocessor. The controller 105 may be coupled to each of the chips 135-150, via a command/address bus 110. The controller 105 may further be coupled to each of the chips 135-150, respectively, via respective I/O buses 115-130. Each of the chips 135-150 may then have their calibration terminals coupled to the ZQ resistor 155. Accordingly, ZQ resistor 155 is shared between all four chips, chip A 135, chip B 140, chip C 145, and chip D 150. In some embodiments, each of the chips A-D 135-150 may individually be a memory device, including, without limitation, DRAM and SDRAM.

In these embodiments, because one ZQ resistor is shared among the chips 135-150 and command/address bus 110 is also shared between the controller 105 and the chips 135-150, each of the chips 135-150 are configured to receive commands concurrently, including ZQ calibration commands. As previously discussed, ZQ calibration operations cannot typically be performed simultaneously among the chips 135-150, so arbitration is required to determine the order in which the chips 135-150 requesting ZQ calibration can perform a ZQ calibration operation. Accordingly, arbiter circuits and corresponding registers are provided to control ZQ calibration operations. Although in FIG. 1 the command/address bus 110 is shared, this should not be taken as a limiting example. Thus, in other embodiments, the command/address bus 110 may include respective lines to each chip 135-150 from the controller 105.

Figure 2:
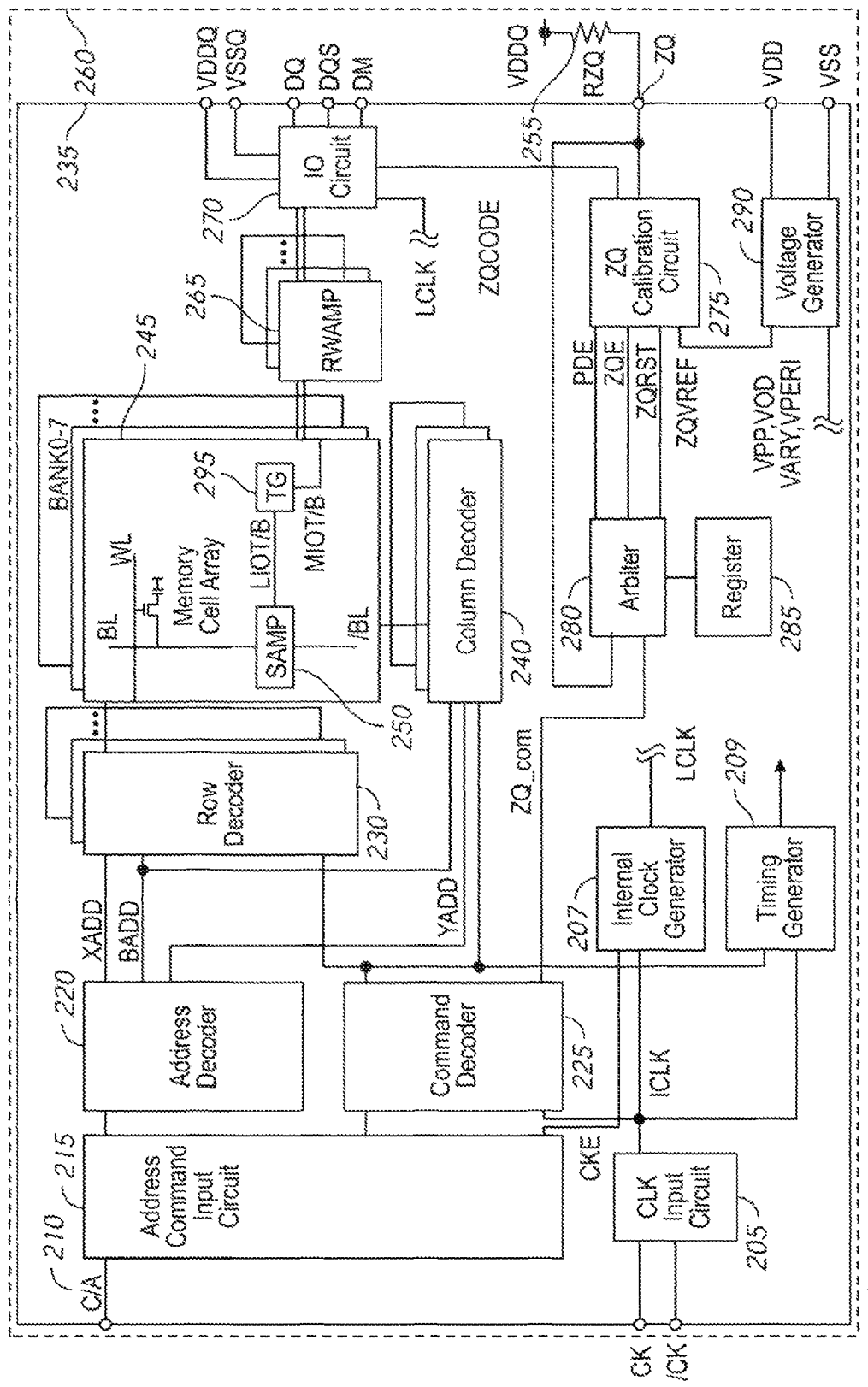
FIG. 2 is a schematic block diagram of one chip of a multi-chip semiconductor device, in accordance with various embodiments.

FIG. 2 illustrates a combination 260 in accordance with various embodiments. The combination 260 includes a memory chip 235 and ZQ resistor (RZQ) 255. In some embodiments, the combination 260 may be used for the combination 160 of the multi-chip semiconductor device 100 previously described with reference to FIG. 1. In particular, the chip 235 may represent the chip 135 and the RZQ 255 may represent the ZQ resistor 155.

The chip 235 may include a clock input circuit 205, internal clock generator 207, timing generator 209, address command input circuit 215, address decoder 220, command decoder 225, row decoder 230, memory cell arrays 245 further including sense amplifiers 250 and transfer gates 295, column decoder 240, read/write amplifiers 265, I/O circuit 270, RZQ 255, ZQ calibration circuit 275, arbiter circuit 280, register 285, and voltage generator 290.

In some embodiments, the chip 235 may include, without limitation, a DDR4 SDRAM, for example. The chip 235 may be mounted on an external substrate 260, for example, a memory module substrate, a mother board or the like. The external substrate 260 may employ an external resistor RZQ 255 that is connected to a calibration terminal ZQ of the multi-chip semiconductor device 200. The external resistor RZQ 255 may be a reference impedance of a ZQ calibration circuit 275. In the present embodiment, the external resistor RZQ 255 is coupled to a ground potential. The ZQ calibration circuit 275 may further be coupled to an arbiter circuit 280, which is in turn coupled to register 285.

The chip 235 may further include a memory cell array 245. The memory cell array 245 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 230 and the selection of the bit line BL is performed by a column decoder 240.

Sense amplifiers 250 are located for their corresponding bit lines BL and connected to at least one respective local I/O line, which is in turn coupled to a respective one of at least two main I/O line pairs, via transfer gates TG 295, which function as switches.

The multi-chip semiconductor device 200 may employ a plurality of external terminals that include address and command terminals coupled to command/address bus 210, clock terminals CK and/CK, data terminals DQ, DQS, and DM, power supply terminals VDD, VSS, VDDQ, and VSSQ, and the calibration terminal ZQ.

The command/address terminals may be supplied with an address signal and a bank address signal from outside. The address signal and the bank address signal supplied to the address terminals are transferred, via the address/command input circuit 215, to an address decoder 220. The address decoder 220 receives the address signal and supplies a decoded row address signal to the row decoder 230, and a decoded column address signal to the column decoder 240. The address decoder 220 also receives the bank address signal and supplies the bank address signal to the row decoder 230, the column decoder 240.

The command/address terminals may further be supplied with a command signal from outside, such as, for example, a memory controller 105. The command signal may be provided, via the command/address bus 210, to the command decoder 225 via the address/command input circuit 215. The command decoder 225 decodes the command signal to generate various internal commands that include a row command signal to select a word line and a column command signal, such as a read command or a write command, to select a bit line, and a calibration signal ZQ_com to the arbiter circuit 280.

Accordingly, when a read command is issued and a row address and a column address are timely supplied with the read command, read data is read from a memory cell in the memory cell array 245 designated by these row address and column address. The read data DQ is output to outside from the data terminals DQ, DQS, and DM via read/write amplifiers 265 and an input/output circuit 270. Similarly, when the write command is issued and a row address and a column address are timely supplied with this command, and then write data is supplied to the data terminals DQ, DQS, DM, the write data is supplied via the input/output circuit 270 and the read/write amplifiers 265 to the memory cell array 245 and written in the memory cell designated by the row address and the column address.

Turning to the explanation of the external terminals included in the semiconductor device 200, the clock terminals CK and/CK are supplied with an external clock signal and a complementary external clock signal, respectively. The external clock signals (including complementary external clock signal) may be supplied to a clock input circuit 205. The clock input circuit 205 may receive the external clock signals to generate an internal clock signal ICLK. The internal clock signal ICLK is supplied to an internal clock generator 207 and thus a phase controlled internal clock signal LCLK is generated based on the received internal clock signal ICLK and a clock enable signal CKE from the address/command input circuit 215. Although not limited thereto, a DLL circuit can be used as the internal clock generator 207. The phase controlled internal clock signal LCLK is supplied to the input/output circuit 270 and is used as a timing signal for determining an output timing of read data. The internal clock signal ICLK is also supplied to a timing generator 209 and thus various internal clock signals can be generated.

The power supply terminals are supplied with power supply potentials VDD and VSS. These power supply potentials VDD and VSS are supplied to an internal voltage generating circuit 290. The internal power supply generating circuit 290 generates various internal potentials VPP, VOD, VARY, VPERI, and the like and a reference potential ZQVREF based on the power supply potentials VDD and VSS. The internal potential VPP is mainly used in the row decoder 230, the internal potentials VOD and VARY are mainly used in the sense amplifiers 250 included in the memory cell array 245, and the internal potential VPERI is used in many other circuit blocks. The reference potential ZQVREF is used in the ZQ calibration circuit 275.

The power supply terminals are also supplied with power supply potentials VDDQ and VSSQ. These power supply potentials VDDQ and VSSQ are supplied to the input/output circuit 270. The power supply potentials VDDQ and VSSQ are the same potentials as the power supply potentials VDD and VSS, respectively. However, the dedicated power supply potentials VDDQ and VSSQ are used for the input/ output circuit 270 so that power supply noise generated by the input/output circuit 270 does not propagate to the other circuit blocks included in the ZQ calibration circuit 275 (not shown in FIG. 2).

The calibration terminal ZQ is connected to the ZQ calibration circuit 275. The ZQ calibration circuit 275 performs a calibration operation with reference to an impedance of RZQ 255, and the reference potential ZQVREF, when activated by the ZQ calibration enable signal ZQE, as generated by the arbiter circuit 280. An impedance code ZQCODE obtained by the calibration operation is supplied to the input/output circuit 270, and thus an impedance of an output buffer (not shown) included in the input/output circuit 270 is specified.

In some embodiments, the arbiter circuit 280 may be activated in response to the ZQ calibration command, ZQ_com, from the controller 105. The arbiter circuit 280 may further receive, as an input, the ZQ pad voltage (VZQ) at the calibration terminal ZQ. In response to receiving ZQ_com, the pull down enable signal (PDE) is activated. The PDE signal may enable an n-channel transistor (NCH) ZQ pulldown to pull down VZQ. If the arbiter circuit 280 determines that it, and the associated chip 235, should gain access to the ZQ resistor RZQ 255, the arbiter circuit 280 may output a ZQ calibration enable signal (ZQE). The ZQE signal may be output to the ZQ calibration circuit 275 to begin ZQ calibration operations on the requesting chip. A ZQ calibration reset signal (ZQRST) may be asserted by the arbiter circuit 280 when ZQ calibration operations are completed.

To determine whether the requesting chip should gain access to RZQ 255, the arbiter circuit 280 may be configured to enable the NCH ZQ pulldown for a set period of time. The timing information may be programmed, or otherwise stored, in register 285. For example, the register 285 may be programmed for chip 235 of the multi-chip semiconductor device 200, with NCH ZQ pulldown timing information specific to chip 235. Thus, each respective register 285 for each respective chip 235 may be configured to store timing information that is different from timing information stored on the registers 285 of any other chip 235. For example, the timing information may be unique to an individual chip among a plurality of chips of the multi-chip semiconductor device 200. The register 285 may include, without limitation, programmable fuses, anti-fuses, a mode register, or other suitable components. Thus, the priority of a chip may be set or programmed via register 285.

Operation of the arbiter circuit 280 will be discussed below with reference to both FIGS. 2 & 5. When the ZQ calibration command ZQ_com is issued, the arbiter circuit 280 may be configured to determine VZQ at the calibration terminal ZQ, to determine whether or not VZQ has been pulled down by another requesting chip or RZQ is currently in use. Thus, in some embodiments, each chip may be configured to have substantially the same pulldown strength on VZQ. Thus, if no chip has enabled an NCH ZQ pulldown, VZQ will be at VDDQ. However, if one or more chips have enabled an NCH ZQ pulldown, VZQ will be lowered to a voltage of about 0.5 times VDDQ or lower. In some embodiments, a range of VDDQ may be utilized. Because the arbiter circuit 280 is comparing VDDQ and 0.5 times VDDQ, low voltage VDDQ may be utilized. For example, in some embodiments, the arbiter circuit 280 may be configured to work with VDDQ that includes, without limitation, 1.1V, 0.6V, and 0.4V, and for multi-chip packages including 2-, 3-, 4-, and 8-chip stacks.

As discussed above, the duration of the NCH ZQ pulldown may be different for each chip of the multi-chip semiconductor device 200. Thus, for example, if chip 235 enables an NCH ZQ pulldown, for example, by asserting the PDE signal, it will pull down VZQ for an amount of time based on the timing information stored in register 285. After enabling the NCH ZQ pulldown for the duration specified, the pulldown may be released. Once the pulldown is disabled, the arbiter circuit 280 may wait for the duration of a ZQ pull up time before determining VZQ. For example, the ZQ pull up time may be the amount of time needed for VZQ to be pulled up, back to VDDQ, by RZQ 255 if not pulled down by any of the chips. In one embodiment, a pull up time of 5 nanoseconds or less may be sufficient. If at the end of the pull up time, VZQ is approximately equal to VDDQ, the requesting arbiter circuit may get access to RZQ and begin ZQ calibration operation. However, if at the end of the pull up time VZQ remains pulled down by another chip, for example, at a voltage of 0.5 times VDDQ or less, then the arbiter circuit 280 may determine that a higher priority chip has issued a ZQ calibration request. In some embodiments, the requesting chip may wait for a ZQ calibration reset signal ZQRST before issuing another ZQ calibration request. In other embodiments, the requesting chip may wait for a subsequent ZQ_com signal before issuing another request. In this way, the arbiter circuit 280 may be configured such that a higher priority chip will always have access to RZQ over a lower priority chip if both chips issue a ZQ calibration request concurrently.

Figure 5:
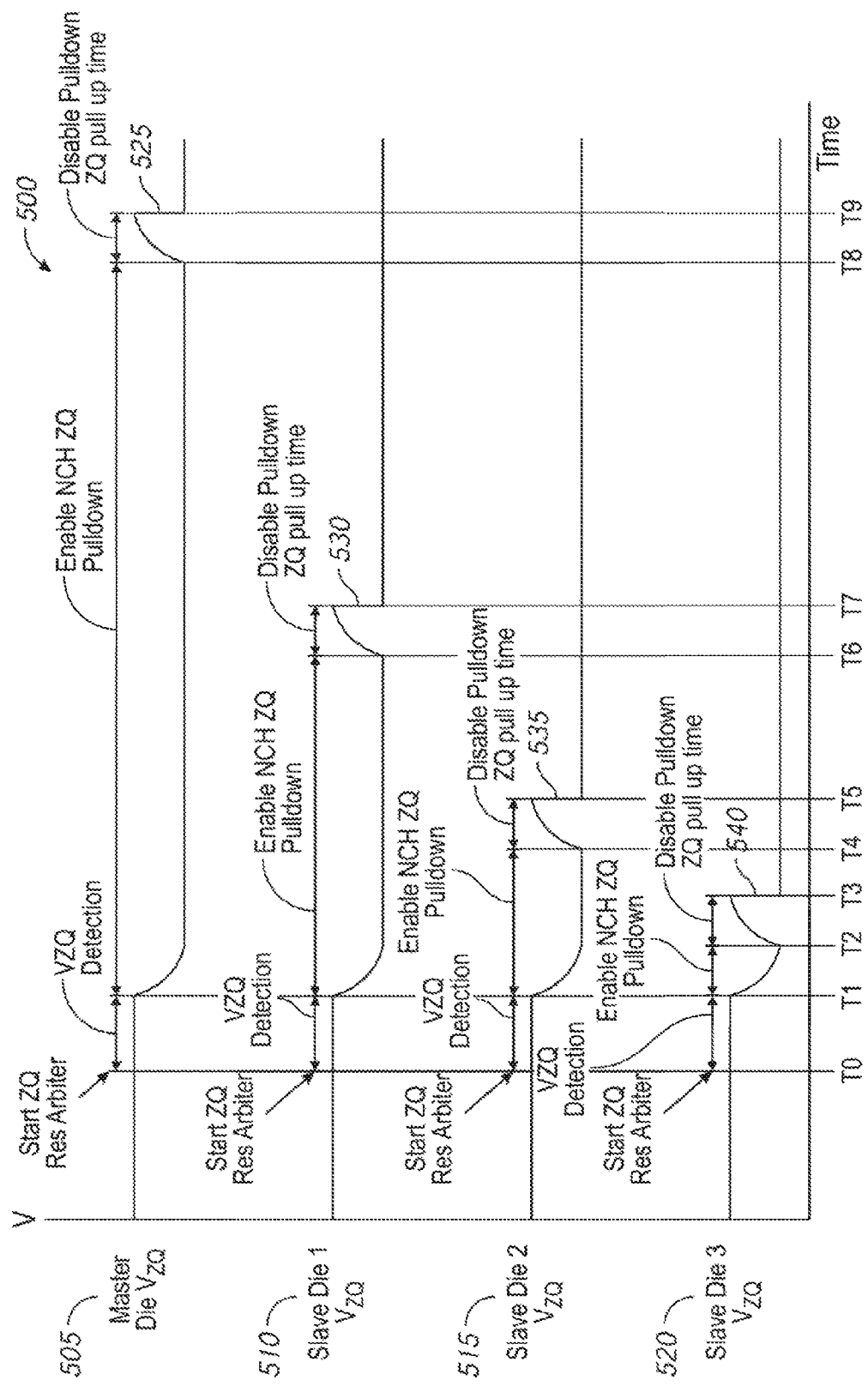
FIG. 5 illustrates ZQ pad voltage in response to ZQ calibration requests from respective chips of a multi-chip device, in accordance with various embodiments.

FIG. 5 illustrates ZQ pad voltages 500 in response to ZQ calibration requests from respective chips of a multi-chip device, in accordance with various embodiments. A total of four chips are used for purposes of illustration only. It is to be understood that in other embodiments, more or less than four chips may be present in a given multi-chip semiconductor device. Master Chip VZQ 505 illustrates VZQ in response to a ZQ calibration request from a master chip. In this example, as well as generally speaking, the master chip may be the highest priority chip in a multi-chip device. Slave Chip 1 VZQ 510 depicts VZQ in response to a ZQ calibration request from slave chip 1, which has the second highest priority to the master chip. Slave Chip 2 VZQ 515 depicts VZQ in response to a calibration request from slave chip 2, which is subservient to both the master chip and slave chip 1. Slave Chip 3 VZQ 520 depicts VZQ in response to a ZQ calibration request from slave chip 3, which has the lowest priority, and is subservient to each of the other chips.

As described above with respect to FIG. 2, in some embodiments, a VZQ detection time may begin upon receipt, by each respective arbiter circuit 280, of a ZQ calibration command, or alternatively upon receipt of ZQ calibration reset signal, ZQRST as depicted at time T0. In further embodiments, the VZQ detection time may begin after a ZQ pull up time has elapsed. In some embodiments, the duration of the VZQ detection time may be the same for each of the chips. The length of the VZQ detection time may be required to be greater than the sum of the maximum ZQ pull up time and the maximum comparator response time. Thus, for example, if the ZQ pull up time is 5 ns from 0V, and the maximum comparator response time is also 5 ns, the VZQ detection time may have a minimum duration of 10 ns.

After the VZQ detection time has elapsed, at time T1, a requesting chip may enable an NCH ZQ pull down. For Master Chip VZQ 505, the NCH ZQ pull down time may be greater than the sum of the NCH ZQ pull down time for slave chip 1 plus the maximum ZQ pull up time, plus the maximum comparator response time. Thus, for Master Chip VZQ 505, the NCH ZQ pull down time may have a length from time T1 to time T8. For Slave Chip 1 VZQ 510, the NCH ZQ pull down time may be greater than the sum of the NCH ZQ pull down time for slave chip 2 plus the maximum ZQ pull up time, plus the maximum comparator response time. Thus, for Slave Chip 1 VZQ 510, the NCH ZQ pull down time may have a length from time T1 to time T6. For Slave Chip 2 VZQ 515, the NCH ZQ pull down time may be greater than the sum of the NCH ZQ pull down time for slave chip 3 plus the maximum ZQ pull up time, plus the maximum comparator response time. Thus, for Slave Chip 2 VZQ 515, the NCH ZQ pull down time may have a length from time T1 to time T4. For Slave Chip 3 VZQ 520, the NCH ZQ pull down time may be greater than the sum of the maximum NCH ZQ pull down time for VZQ to reach a minimum voltage, for example 0V, plus the maximum ZQ pull up time, plus the maximum comparator response time. Thus, for Slave Chip 3 VZQ 520, the NCH ZQ pull down time may have a length from time T1 to time T2.

As described previously, the duration of each chip's respective NCH ZQ pull down time may be stored in the chip's respective register 285. Moreover, each respective NCH ZQ pull down time may be different from the NCH ZQ pull down time of any other chip, as long as the relationship described above is followed.

In embodiments employing additional chips, the NCH ZQ pull down time may be defined similarly as above, with the lowest priority chip having an NCH ZQ pull down time that may be greater than the sum of the maximum NCH ZQ pull down time for VZQ to reach a minimum voltage, plus the maximum ZQ pull up time, plus the maximum comparator response time. Each subsequent higher priority chip may then follow the relationship set forth above, where the NCH ZQ pull down time must be greater than the sum of the NCH ZQ pull down time for the immediately lower priority chip, plus the maximum ZQ pull up time, plus the maximum comparator response time.

After the NCH ZQ pull down time has elapsed, the arbiter circuit 280 may release the pull down for the duration of the ZQ pull up time before determining the VZQ. Thus, for the Master Chip VZQ 505, the arbiter circuit 280 for the master chip may determine VZQ 525 at time T9. For the Slave Chip 1 VZQ 510, the arbiter circuit 280 for slave chip 1 may determine VZQ 530 at time T7. For the Slave Chip 2 VZQ 515, the arbiter circuit 280 for slave chip 2 may determine VZQ 535 at time T5. For the Slave Chip 3 VZQ 520, the arbiter circuit 280 for slave chip 3 may determine VZQ 540 at time T3. If VZQ is determined to be at VDDQ, then the arbiter circuit 280 may get access to RZQ and begin the ZQ calibration procedure. If, however, VZQ is determined to be pulled down by another chip, a ZQ calibration request may be issued by the arbitration circuit 280 at a later time, such as, without limitation, after a subsequent VZQ detection time immediately after the ZQ pull up time 525, 530, 535, 540, after receipt of ZQRST signal, or after another ZQ calibration command ZQ_com has been issued.

Figure 3:
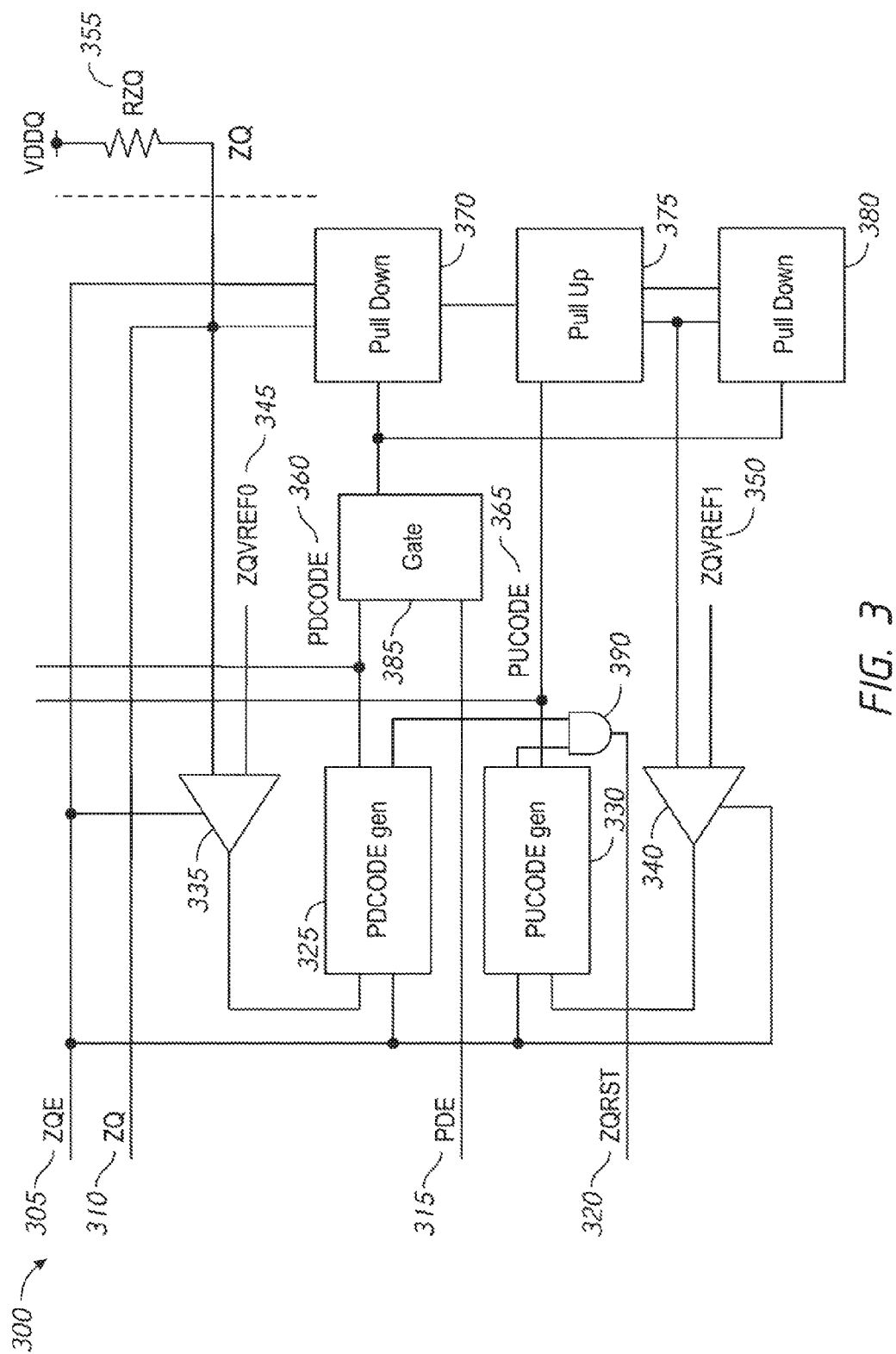
FIG. 3 is a ZQ calibration circuit, in accordance with various embodiments.

FIG. 3 is a circuit diagram of a ZQ calibration circuit 300, in accordance with various embodiments. The ZQ calibration circuit 300 includes inputs for input signals ZQE 305, PDE 315, ZQRST 320, a calibration terminal ZQ 310. A pull down code generator 325 may be configured to generate a pull down code PDCODE 360 based on the output of a first comparator 335. The first comparator 335 may be configured to compare VZQ to a first ZQ reference voltage ZQVREF0 345. A pull up code generator 330 may be configured to generate a pull up code PUCODE 365 based on the output of a second comparator 340. The second comparator 340 may be configured to compare VZQ to a second ZQ reference voltage ZQVREF1 350. These components have been described in the abstract and are not to be construed as limiting of any specific embodiment.

In some embodiments, a first pull down circuit 370 coupled to RZQ 355 may be activated by gate 385 to pull down the voltage VZQ at the calibration terminal (ZQ). A pull down circuit 370 may comprise a plurality of transistors coupled in parallel between VSSQ (not shown), and the calibration terminal ZQ. A pull down circuit 380 may comprise a plurality of transistors coupled in parallel between VSSQ (not shown) and an intermediate terminal coupled to the second comparator 340. A pull up circuit 375 may comprise a plurality of transistors coupled in parallel between VDDQ (not shown) and the intermediate terminal. Gate 385 may enable some or all of the plurality of transistors of pull down circuits 370, 380 regardless of PDCODE 360 when the PDE signal 315 is asserted. The ZQE signal 305 is configured to enable all related blocks, including, but not limited to, the first and second comparators 335, 340, the pull down code generator 325, pull up code generator 330, the first and second pull down circuits 370, 380, and pull up circuit 375. The calibration circuit 300 enables the ZQRST signal 320, via logic 390, when both pull down code generator 325 and pull up code generator 330 detect the end of pull down and/or pull up ZQ calibration operations. The ZQE signal may further be disabled by the ZQRST signal.

In some alternative embodiments, the first pull down circuit 370 may simply be a driver circuit for either pulling down or pulling up VZQ based on the implementation. Although FIG. 3 depicts RZQ 355 as coupled to VDDQ, this example should not be taken as limiting. For example, in other embodiments, RZQ may alternatively be connected to VSSQ. In such embodiments, the calibration terminal ZQ may be coupled to a driver circuit that pulls up VZQ instead of first pull down circuit 370. Thus, the driver circuit, as with the pull down/pull up circuits, may be an on-chip driver circuit specific to a respective individual chip.

Figure 4:
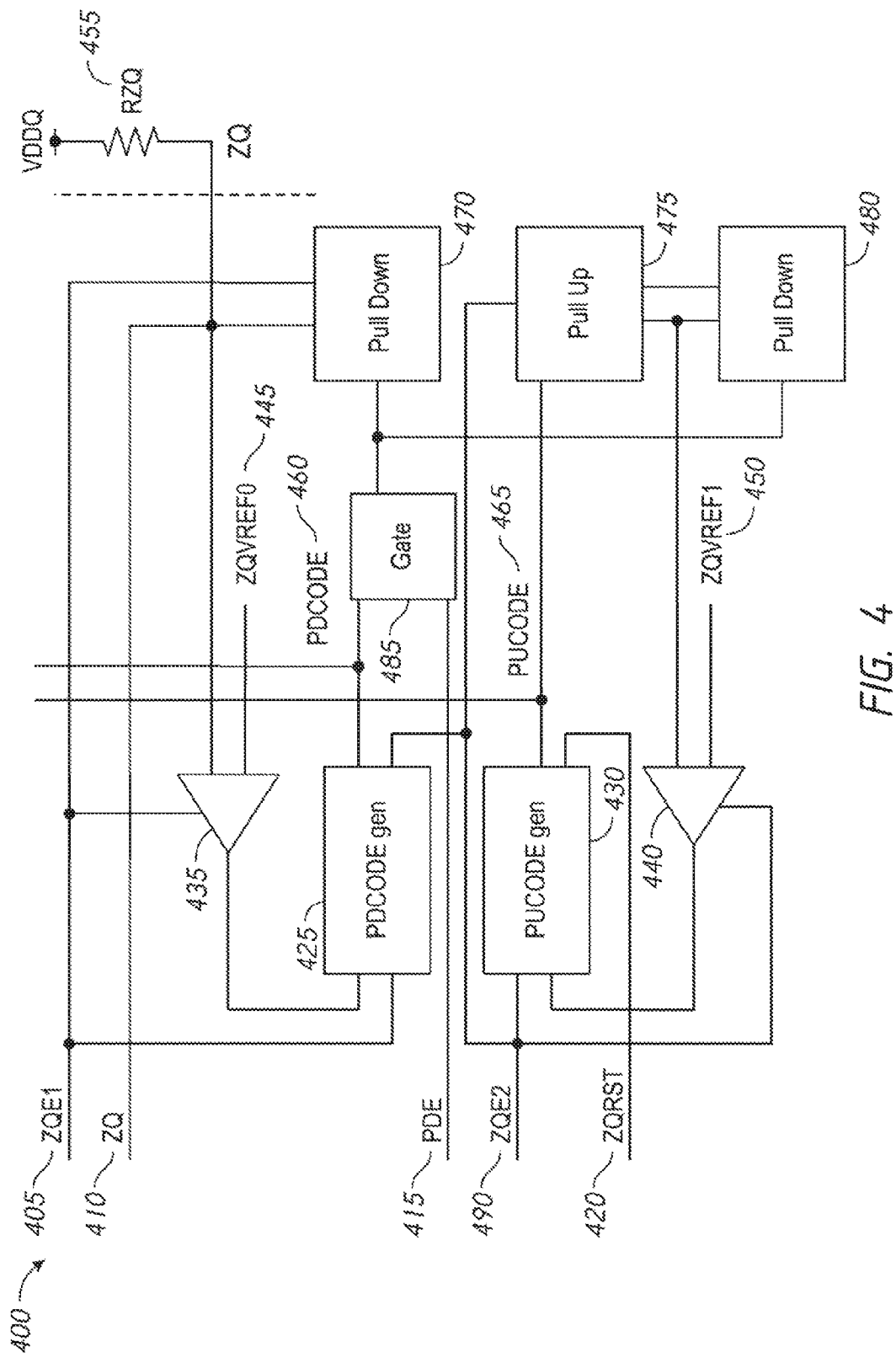
FIG. 4 is an alternative ZQ calibration circuit, in accordance with various embodiments.

FIG. 4 is a circuit diagram of an alternative ZQ calibration circuit 400, in accordance with various embodiments. As in FIG. 3, the ZQ calibration circuit 400 includes inputs for input signals ZQE1 405, PDE 415, ZQRST 420, ZQE2 490, and a calibration terminal ZQ 410, as described previously with respect to FIG. 3. Similarly, as previously described in FIG. 3, a pull down code generator 425 may be configured to generate a pull down code PDCODE 460 based on the output of a first comparator 435. The first comparator may be configured to compare VZQ to a first ZQ reference voltage ZQVREF0 445. A pull up code generator 430 may be configured to generate a pull up code PUCODE 465 based on the output of a second comparator 440. The second comparator may be configured to compare VZQ to a second reference voltage ZQVREF1 450. These components have again been described in the abstract for purposes of explanation and are not to be construed as limiting of any specific embodiment.

Here, in contrast with ZQ calibration circuit 300 of FIG. 3, the ZQ calibration operation is defined as a two part operation in which the pull down calibration operation and pull up calibration operation are separate. Thus, after pull down code generator 425 detects the end of a calibration operation only for pull down side, the ZQE2 signal 490 is enabled. The ZQE2 signal 490 then triggers the start of the pull up calibration operation only for the pull up side, and also resets the ZQE1 signal 405. After the pull up code generator 430 detects that calibration operations for the pull up side have ended, the ZQRST signal 420 may be enabled while also resetting the ZQE2 signal 490. Therefore, in contrast with the calibration circuit 300 of FIG. 3, RZQ 455 may be released after the ZQE1 signal 405 is reset and the ZQE2 signal 490 is enabled. Once released, another chip may be able to start ZQ calibration operations on the pull down side, concurrently with the pull up calibration operations for the original chip.

Figure 6:
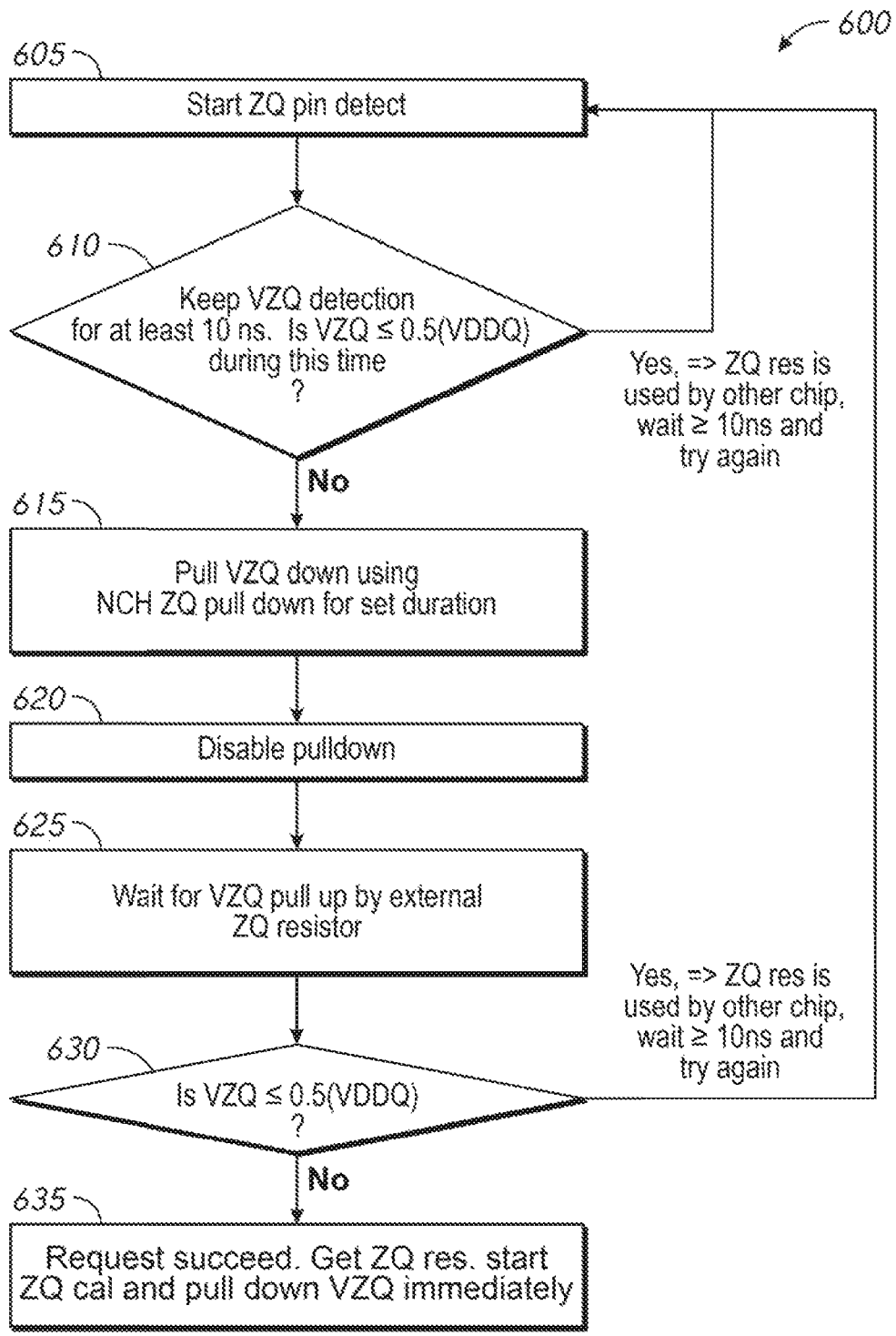
FIG. 6 is a flow diagram of a method of using a timing based arbiter circuit for ZQ calibration, in accordance with various embodiments.

FIG. 6 is a flow diagram of a method 600 of using an arbiter circuit for timing based ZQ calibration, in accordance with various embodiments. The method 600 begins, at block 605, by detecting a voltage at the ZQ pin. The voltage at the ZQ pin may include, as described with respect to FIGS. 2-4, the voltage at the calibration terminal, ZQ, or a ZQ pad voltage (VZQ). At decision block 610, VZQ is monitored for, as an example, at least 10 ns. During the 10 ns, the arbiter circuit determines whether VZQ is ever pulled down (e.g. 0.5 times VDDQ or below). In some cases, VZQ may be compared to a ZQ reference voltage, ZQVREF. For example, in some embodiments, ZQVREF may be approximately 0.8 times VDDQ. As a result of the large difference in VDDQ when it is and is not pulled down, the arbiter circuit may be able to detect when VZQ is pulled down with VDDQ values lower than those required by conventional arbiter circuits. For example, VDDQ may include, without limitation, 1.1 V, 0.6V, and 0.4V. If VZQ is determined to have been pulled down, the arbiter circuit may wait at least 10 ns before issuing another ZQ calibration request.

If VZQ is not pulled down during that time, the method 600 continues, at block 615, by enabling an NCH ZQ pull down for a set duration. As described above, the duration of the NCH ZQ pull down may vary, depending on the number of chips on the semiconductor device. Moreover, the duration of the NCH ZQ pull down may be different for each chip of the multi-chip semiconductor device. Furthermore, the duration of the NCH ZQ pull down may be stored in a respective register for each chip of the multi-chip semiconductor device.

At block 620, NCH ZQ pull down is disabled by the arbiter circuit after the set duration of the NCH ZQ pull down has elapsed. At block 625, the arbiter circuit waits for the duration of a ZQ pull up time, for VZQ to be pulled up by the external ZQ resistor. Then, at decision block 630, it is determined whether VZQ is pulled down (e.g. less than or equal to 0.5 times VDDQ). If VZQ is pulled down by another chip, the arbiter circuit may wait at least 10 nanoseconds before attempting to issue a ZQ calibration request. If VZQ is not pulled down (e.g. equal to VDDQ), at block 635, the ZQ calibration request has succeeded and the arbiter circuit may enable the ZQ calibration process and pull down VZQ immediately.

While certain features and aspects have been described with respect to exemplary embodiments, one skilled in the art will recognize that various modifications and additions can be made to the embodiments discussed without departing from the scope of the invention. Although the embodiments described above refer to particular features, the scope of this invention also includes embodiments having different combination of features and embodiments that do not include all of the above described features. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture, but instead can be implemented on any suitable hardware, firmware, and/or software configuration. Similarly, while certain functionality is ascribed to certain system components, unless the context dictates otherwise, this functionality can be distributed among various other system components in accordance with the several embodiments.

Moreover, while the procedures of the methods and processes described herein are described in a particular order for ease of description, various procedures may be reordered, added, and/or omitted in accordance with various embodiments. The procedures described with respect to one method or process may be incorporated within other described methods or processes; likewise, hardware components described according to a particular structural architecture and/or with respect to one system may be organized in alternative structural architectures and/or incorporated within other described systems. Hence, while various embodiments are described with or without certain features for ease of description, the various components and/or features described herein with respect to a particular embodiment can be combined, substituted, added, and/or subtracted from among other described embodiments. Consequently, although several exemplary embodiments are described above, it will be appreciated that the invention is intended to cover all modifications and equivalents within the scope of the following claims.

What is claimed is:

1. A system comprising:
a resistor; and
a plurality of chips, wherein each of the plurality of chips comprises:
a terminal coupled to the resistor;
a register storing timing information; and
an arbiter circuit configured to determine whether the resistor is available based, at least in part, on the timing information stored in the register;
wherein the timing information stored in the register of each of the plurality of chips is unique to a corresponding one of the plurality of chips.

2. The system of claim 1, wherein each of the plurality of chips further comprises a driver circuit coupled to the terminal and the arbiter circuit is further configured to enable the driver circuit to change the potential level of the terminal before determining whether the resistor is available in each of the plurality of chips.

3. The system of claim 2, wherein the arbiter circuit is further configured to enable the driver circuit for a duration of time that is unique to each respective chip among the plurality of chips.

4. The system of claim 2, wherein each of the plurality of chips further comprises a calibration control circuit coupled to the driver circuit and the calibration control circuit is configured to adjust an impedance of the driver circuit after the arbiter circuit determines that the resistor is available in each of the plurality of chips.

5. The system of claim 1, further comprising a controller configured to issue a calibration command, concurrently to each of the plurality of chips, wherein the arbiter circuit of each of the plurality of chips determines whether the resistor is available, responsive to the calibration command.

6. The system of claim 3, wherein the availability of the resistor is determined based on the potential level of the terminal after the duration of time unique to the respective chip has elapsed.

7. The system of claim 3, wherein the duration of time for a first chip is determined, at least in part, on the duration of time for a second chip, wherein the second chip is subservient to the first chip.

8. The system of claim 1, wherein the register is a programmable register.

9. The system of claim 2, wherein the arbiter circuit is configured to enable the driver circuit of a first chip to change the potential level of the terminal concurrently with at least one of a pull down or pull up calibration operation on a second chip of the plurality of chips.

10. The system of claim 2, wherein the driver circuit is a pull down circuit.

11. An apparatus comprising:
a resistor coupled between a supply voltage and a terminal; and
a chip comprising:
an arbiter circuit coupled to the resistor via the terminal; and
a register, in communication with the arbiter circuit, configured to store timing information;
wherein the arbiter circuit is configured to:
receive a calibration command;
determine, in response to the calibration command, whether the resistor is available based on a voltage at the terminal;
drive, via a driver circuit and in response to determining that the resistor is available, the voltage at the terminal in one of a pull down or pull up direction, for a duration of time based on the timing information stored in the register; and
determine, after the duration of time has elapsed, whether the resistor is available.

12. The apparatus of claim 11, wherein the arbiter circuit is further configured to:
transmit, to a calibration circuit, an enable signal for a calibration operation, in response to determining that the resistor is available after the duration of time has elapsed.

13. The apparatus of claim 12, wherein the arbiter circuit is further configured to:
drive, via the driver circuit, the voltage at the terminal concurrently with a calibration operation on a second chip of the multi-chip package.

14. The apparatus of claim 11, wherein the timing information stored in the register is unique to the chip among the multi-chip package.

15. The apparatus of claim 11, wherein the arbiter circuit is further configured to drive the voltage at the terminal in the at least one of the pull up or pull down direction in response to determining that the resistor is available after the duration of time has elapsed.

16. The apparatus of claim 11, wherein the duration of time includes a duration of time it takes for the resistor to one of pull up or pull down, in the opposite direction of the driver circuit, the voltage at the terminal.

17. The apparatus of claim 11, wherein the driver circuit is a pull down circuit.

18. The apparatus of claim 17, wherein if the resistor is not available, the arbiter circuit is further configured to wait a pull up time before again attempting to determine whether the resistor is available.

19. A method comprising:
detecting a voltage at a terminal coupled to a resistor;
determining whether the resistor is available based on the voltage;
enabling a driver circuit included in a chip for a duration of time based on timing information stored in a register included in the chip, wherein the timing information is unique to the chip among other chips;
pulling up or down the voltage for the duration of time; and
determining whether the resistor is available, based on the voltage, after the duration of time has elapsed.

20. The method of claim 19 further comprising:
transmitting an enable signal to a calibration circuit for a calibration operation responsive to determining that the resistor is available after the duration of time has elapsed.

* * * * *